(12) United States Patent
Hwang

(10) Patent No.: US 8,344,991 B2
(45) Date of Patent: Jan. 1, 2013

(54) DISPLAY DEVICE AND DRIVING METHOD THEREOF

(75) Inventor: In-Jae Hwang, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 600 days.

(21) Appl. No.: 12/568,270

(22) Filed: Sep. 28, 2009

(65) Prior Publication Data

US 2010/0097368 A1 Apr. 22, 2010

(30) Foreign Application Priority Data

Oct. 16, 2008 (KR) .................. 10-2008-0101631

(51) Int. Cl.
*G09G 3/36* (2006.01)

(52) U.S. Cl. ........................ 345/100; 345/213
(58) Field of Classification Search .................. None
See application file for complete search history.

(56) References Cited

U.S. PATENT DOCUMENTS

| 7,310,402 B2* | 12/2007 | Wei et al. .......................... 377/64 |
| 7,548,228 B2* | 6/2009 | Pak et al. ......................... 345/100 |
| 8,120,598 B2* | 2/2012 | Shin et al. ....................... 345/204 |
| 2007/0040795 A1* | 2/2007 | Lee et al. ........................ 345/100 |
| 2007/0052658 A1* | 3/2007 | Kim .................................. 345/100 |
| 2009/0021502 A1* | 1/2009 | Lee et al. ........................ 345/205 |

* cited by examiner

*Primary Examiner* — Jason Olson
(74) *Attorney, Agent, or Firm* — F. Chau & Associates, LLC

(57) ABSTRACT

A display device and a driving method of the same are provided. The display device includes a display panel having gate lines and data lines. A gate driver is included in each of stages and supplies each of the plurality of gate lines with gate signals using a clock signal and a clock bar signal. Each of the stages includes a gate output terminal through which the gate signal is outputted, a pull-down unit connected to the gate output terminal that pulls down a level of the gate signal using a first gate-off voltage. A holding unit is connected to the gate output terminal and holds the level of the pulled-down gate signal at a level of a second gate-off voltage using the second gate-off voltage, which is higher than the first gate-off voltage.

20 Claims, 9 Drawing Sheets

DISPLAY DEVICE AND DRIVING METHOD THEREOF

CROSS-REFERENCE TO RELATED APPLICATION

This application claims priority to and the benefit of Korean Patent Application No. 10-2008-0101631 filed on Oct. 16, 2008 in the Korean Intellectual Property Office, the entire content of which is incorporated herein by reference.

BACKGROUND OF THE INVENTION

1. Field of the Invention

The present invention relates to a display device and a driving method thereof.

2. Description of the Related Art

A typical liquid crystal display (LCD) includes a liquid crystal layer disposed between a color filter display panel having reference electrodes and color filters, and a thin film transistor (TFT) display panel having switching elements and pixel electrodes. Different voltages are applied to the pixel and reference electrodes to generate an electric field so that the orientation of liquid crystal molecules is changed and the light transmittance thereof is controlled, thereby displaying an image.

In many LCDs, gate driving integrated circuits (ICs) are mounted in a tape carrier package (TCP), a chip on glass (COG) or other suitable mounting method. However, other methods have been explored in search of improved manufacturing costs or product size and design. For example, one method does not use gate driving ICs. Instead, gate drivers which generate gate signals using amorphous silicon thin film transistors ("a-Si TFTs") are mounted on glass substrates.

Therefore, many attempts are being made to improve the display quality of an LCD, especially to address causes of deterioration in the display quality of the LCD.

SUMMARY OF THE INVENTION

In accordance with exemplary embodiments of the present invention a display device having improved display quality, and a driving method thereof, is provided.

According to an exemplary embodiment of the present invention, there is provided a display device which includes a display panel having gate lines and data lines. A gate driver has stages that supply the gate lines with gate signals using a clock signal and a clock bar signal. Each of the stages includes a gate output terminal through which a gate signal is outputted. A pull-down unit is connected to the gate output terminal and pulls down a level of the gate signal using a first gate-off voltage. A holding unit is connected to the gate output terminal and holds the level of the pulled-down gate signal at a level of a second gate-off voltage using the second gate-off voltage, which is higher than the first gate-off voltage.

According to an exemplary embodiment of the present invention, there is provided a display device which includes a display panel having switching elements at intersection areas of gate lines and data lines. A gate driver supplies the gate lines with gate signals for turning ON/OFF the switching elements. Each of the gate signals includes a gate-on period in which the switching elements are turned ON, and first and second gate-off periods in which the switching elements are turned OFF. The gate signal has a level of the gate-on voltage during the gate-on period. The gate signal is shifted from the level of the gate-on voltage to a level of a third gate-off voltage and is held at the third gate-off voltage level during the first gate-off period. The gate signal is shifted from the third gate-off voltage level to the second gate-off voltage level, which is higher than the third gate-off voltage level, and is held at the second gate-off voltage level during the second gate-off period.

According to an exemplary embodiment of the present invention, there is provided a method of driving a display device. Gate lines and data lines are supplied with gate signals from a gate driver using a clock signal and a clock bar signal. Images are displayed using the gate signals and the data signals. The supplying of the gate signals includes pulling up a level of each of the gate signals to a level of a gate-on voltage, pulling down the level of each of the gate signals from the gate-on voltage level using a first gate-off voltage, and shifting the level of each of the gate signals to a level of a second gate-off voltage, which is higher than the first gate-off voltage, and holding the gate signal at the second gate-off voltage level.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
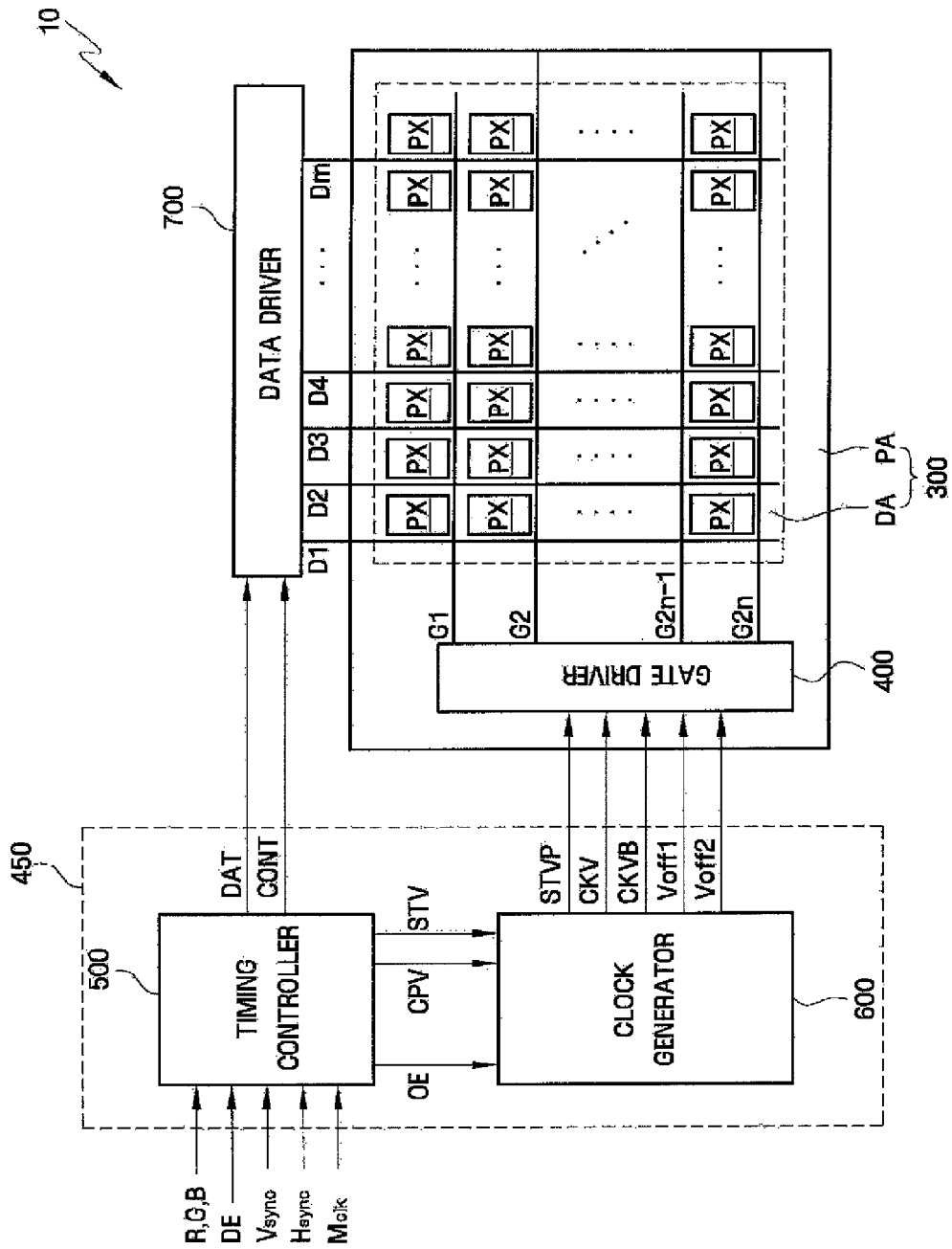
FIG. 1 is a block diagram of a display device according to an exemplary embodiment of the present invention.

Referring to FIG. 1, the display device 10 includes a display panel 300, a signal supply unit, a gate driver 400 and a data driver 700. The signal supply unit includes a timing controller 500 and a clock generator 600.

The display panel 300 includes a display area DA displaying an image and a peripheral area PA adjacent to the display area, where no image is displayed.

The display area DA is an area on which an image is displayed and includes a first substrate having first to nth gate lines G1-G2n (n being an integer greater than 2), first to mth data lines D1-Dm (where m is an integer greater than 2), switching elements and pixel electrodes, a second substrate having color filters and a common electrode, and a liquid crystal layer between the first and second substrates. The first to 2nth gate lines G1-G2n extend in a transverse direction to be substantially parallel to each other, and the first to mth data lines D1-Dm extend in a longitudinal direction to be substantially parallel to each other.

Figure 2:
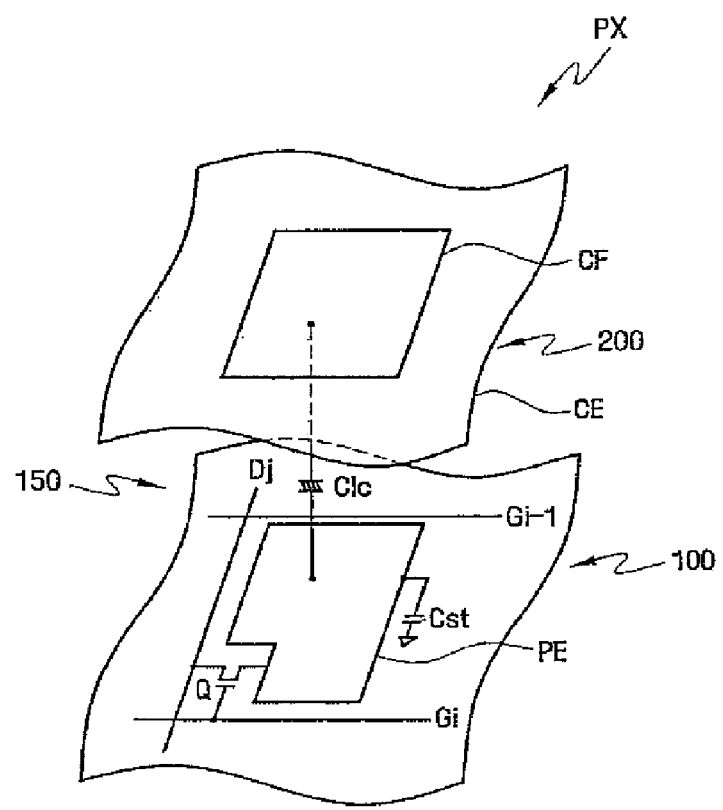
FIG. 2 is a circuit diagram of an exemplary pixel shown in FIG. 1.

Referring now to FIG. 2, each pixel, for example a pixel PX shown in FIG. 1, will now be described. Each pixel PX includes a color filter CF in a region of the first panel 100 corresponding to a pixel electrode PE. For example, the pixel PX connected to the ith gate line Gi (where i=1~n) and the jth data line Dj (where j=1~m), includes a switching element Q that is connected to the signal lines Gi, Dj and a liquid crystal capacitor Clc and a storage capacitor Cst that are connected to the switching element Q. The storage capacitor Cst may be omitted, if necessary. The switching element Q is an amorphous silicon thin film transistor (a-Si TFT).

The PA, which surrounds the DA, is an area that is not used to display images. Accordingly, the first panel 100 of FIG. 2 is typically wider than the second panel 200 of FIG. 2.

Referring back to FIG. 1, an external graphic controller (not shown) supplies a signal supply unit 450, which includes the timing controller 500 and the clock generator 600, with input image signals R, G, B and input control signals that control the display of the input image signals R, G, B. The signal supply 450 unit supplies the data driver 700 with a data signal DAT and a data control signal CONT. The timing controller 500 receives the input control signals, including a horizontal synchronization signal Hsync, a main clock Mclk, a data enable signal DE and outputs the data control signal CONT. Here, the data control signal CONT includes a horizontal synchronization start signal for starting the operation of the data driver 700, a load signal for instructing outputs of two data voltage signals.

Accordingly, the data driver 700 receives the image signal DAT and the data control signal CONT from the signal supply unit 450 and supplies the data lines D1-Dm with image data voltages corresponding to the image signal DAT. The data driver 700 may be connected to the liquid crystal panel assembly 300 in the form of a TCP as at least one IC chip. However, the connection between the data driver 700 and the liquid crystal panel assembly 300 is not limited to the illustrated example. For example, the data driver 700 may be provided on the PA of the liquid crystal panel assembly 300.

The signal supply unit 450 receives vertical synchronizing signal $V_{sync}$, a main clock $M_{clk}$, etc., from the external graphic controller, and supplies the gate driver 400 with a scanning start signal STVP, a clock signal CKV, a clock bar signal CKVB, a first gate-off voltage Voff1 and a second gate-off voltage Voff2. In more detail, the clock generator 600 receives a source scanning start signal STV from the timing controller 500 to then output the scanning start signal STVP, receives a clock generation control signal OE and a gate clock generation control signal CPV to then output the clock signal CKV and the clock bar signal CKVB. Here, the clock signal CKV is an inverted signal of the clock bar signal CKVB.

The gate driver 400, which is enabled by the scanning start signal STVP, generates gate signals Gout(1)-Gout(2n) using the clock signal CKV, the clock bar signal CKVB, the first gate-off voltage Voff1 and the second gate-off voltage Voff2, and sequentially applies the respective gate signals Gout(1)-Gout(2n) to the first to 2nth gate lines G1-G2n. The gate driver 400 is formed on the PA of the display panel 300 and connected to the DA of display panel 300 and, in turn, the pixels PX as shown in FIG. 2. In other words, the gate driver 400 may be mounted on a glass substrate of the display panel 300 using an a-Si TFT, but is not limited thereto. The gate driver 400 may include at least one IC chip mounted on the display panel 300 as a TCP type, which is attached to the display panel 300.

The gate driver 400 will now be described in more detail with reference to FIG. 3. The gate driver 400 includes stages ST_1-ST_2n+1, which are cascaded to one another. The stages ST_1-ST_2n+1 except for the last stage ST_2n+1 are connected to the gate lines G1-G2n, and provide output gate signals Gout(1)-Gout(2n), respectively. The first gate-off voltage Voff1, the second gate-off voltage Voff2, the clock signal CKV, the clock bar signal CKVB and an initialization signal MT are inputted to the respective ST_1-ST_2n. Here, the initialization signal INT may be supplied from the clock generator 600.

Each of the stages ST_1-ST_2n+1 includes first and second clock terminals CK1, CK2, a set terminal S, a first reset terminal R1, a second reset terminal R2, a first power voltage terminal GV1, a second power voltage terminal GV2, a frame reset terminal FR, a gate output terminal OUT1, and a carry output terminal OUT2.

For example, the set terminal S of a jth (j≠1) stage ST_j connected to a jth gate line Gi receives a carry signal Cout(j−1) of the previous stage ST_j−1, the reset terminal R receives a gate signal Gout(j+1) of the next stage ST_j+1, the first clock terminal CK1 and the second clock terminal CK2 receive the clock signal CKV and the clock bar signal CKVB, respectively, the power supply voltage terminal GV receives the first and second gate-off voltages Voff1, Voff2, and the frame reset terminal FR receives the initialization signal INT or the carry signal Cout(2n+1) of the last stage ST_2n+1. The gate signal Gout(j) is outputted through the gate output terminal OUT1, and the carry signal Cout(j) is outputted through the carry output terminal OUT2. However, the scanning start signal STVP, instead of the previous stage carry signal, is inputted to the first stage ST_1, and the scanning start signal STVP, instead of the next stage gate signal, is inputted to the last stage ST_2n+1.

While it has been described that the clock signal CKV and the clock bar signal CKVB are applied to the first clock terminal CK1 and the second clock terminal CK2 of the jth stage ST_j, the clock signal CKV or the clock bar signal CKVB may be alternately inputted to the first clock terminal CK1 and the second clock terminal CK2 of each of the stages ST_1-ST_2n. For example, the clock signal CKV and the clock bar signal CKVB may be applied to the first and second clock terminals CK1, CK2 of odd-numbered stages ST_1-ST_2n−1, and the clock bar signal CKVB and the clock signal CKV may be applied to the first and second clock terminals CK1, CK2 of even-numbered stages ST_2-ST_2n.

The jth stage ST_j shown in FIG. 3, and an alternative jth stage ST_j' will now be described in more detail with reference to FIGS. 4a, 4b and 5.

Figure 4A:
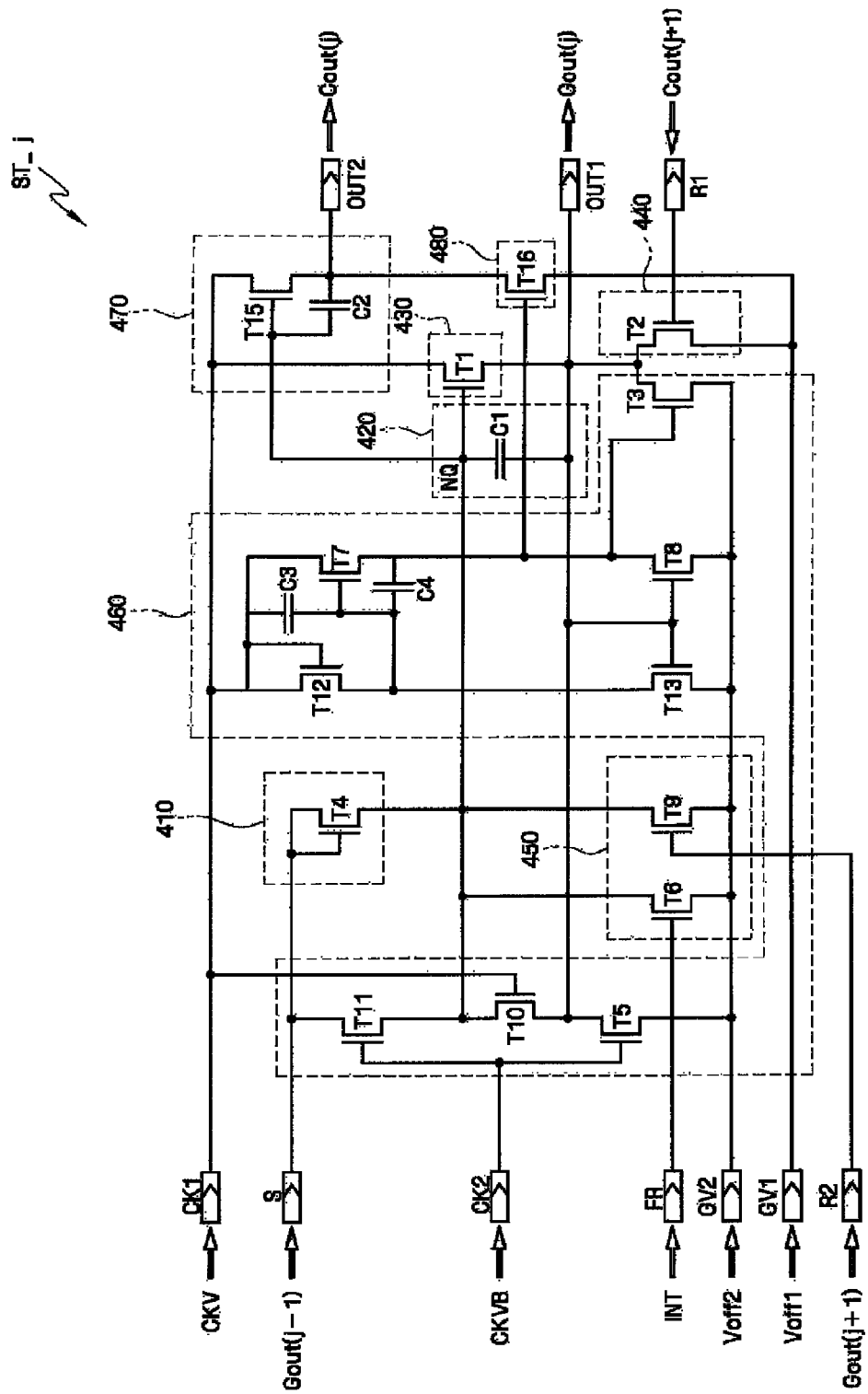
FIGS. 4a and 4b are exemplary circuit diagrams of a jth stage shown in FIG. 3.

Referring first to FIG. 4a, the jth stage ST_j may include a buffer unit 410, a charging potion 420, a pull-up unit 430, a carry signal generating unit 470, a pull-down unit 440, a carry signal pull-down unit 480, a discharging unit 450, and a holding unit 460. The jth stage ST_j is supplied with the first gate-off voltage Voff1, the second gate-off voltage Voff2, the gate signal Gout(j−1) of the previous stage ST_j−1, the gate signal Gout(j+1) of the next stage ST_j−1, the carry signal Cout(j+1) of the next stage ST_j+1, the clock signal CKV and the clock bar signal CKVB, and a gate signal Gout(j) and a carry signal Cout(j) are output from the jth stage ST_j.

Figure 5:
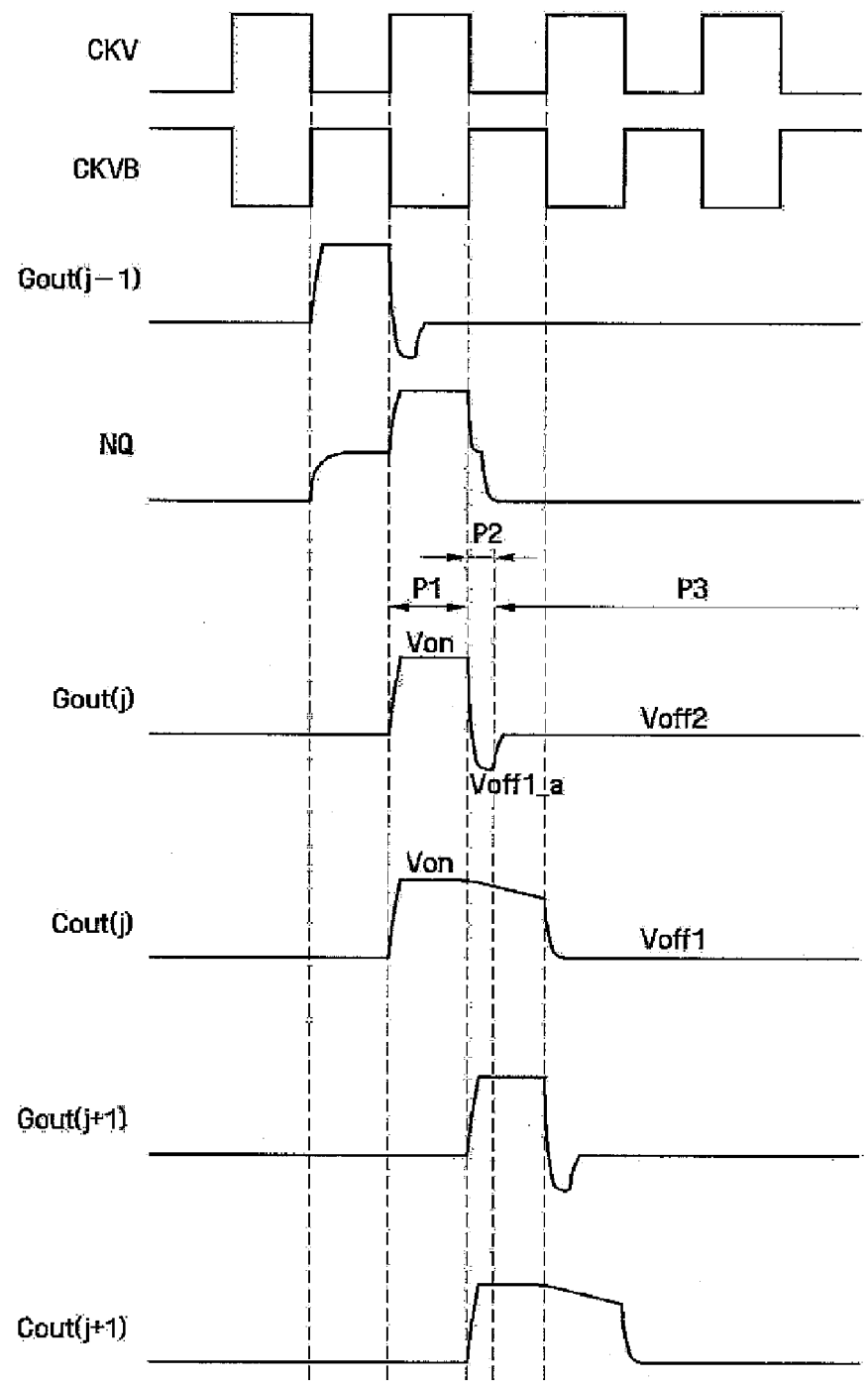
FIG. 5 is a timing diagram for explaining the operation of a jth stage shown in FIG. 3.

Referring now to FIG. 5, the gate signal Gout(j) supplied from the jth stage ST_j may have a gate-on period P1, a first gate-off period P2, and a second gate-off period P3. Here, the gate-on period P1 is a period in which a switching element Q connected to the gate lines G1-G2n is turned ON in response to the gate signal Gout(1)-Gout(2n), and the first and second gate-off periods P2, P3 are periods in which the switching element Q connected to the gate lines G1-G2n is turned OFF in response to the gate signals Gout(1)-Gout(2n). In other words, during the gate-on period P1, the gate signals Gour(1)-Gout(2n) having a gate-on voltage Von by which the switching element Q is turned ON are supplied, and during the first and second gate-off periods P2, P3, the gate signals Gour(1)-Gout(2n) having the first and second gate-off voltages Voff1a, Voff2 by which the switching element Q is turned OFF are supplied.

The buffer unit 410 supplies the previous stage gate signal Gout(j−1) inputted through the set terminal S to the carry signal generating unit 470 and the pull-up unit 430. The buffer unit 410 may include a transistor T4 with a gate electrode and a drain electrode connected, as shown in FIG. 4a. However, the configuration of the buffer unit 410 is not limited to the illustrated example and may have various configurations in other exemplary embodiments of the present invention. As shown in the alternative embodiment ST_j' of FIG. 4b, for example, a buffer unit 411 supplies the gate-on voltage Von inputted through a second set terminal S2 in response to the previous stage gate signal Gout(j−1) inputted through a first set terminal S1 to the charging unit 420, the carry signal generating unit 470 and the pull-up unit 430. The buffer unit 411 may include, for example, a transistor T4a with a drain electrode connected to the second set terminal S2, a gate electrode connected to the first set terminal S1 and a source electrode connected to the charging unit 420, the carry signal generating unit 470 and the pull-up unit 430. In a case where the buffer unit 411 is configured in such a manner as shown in FIG. 4b, the gate driver (400 of FIG. 3) can operate in a stable manner without deterioration in operating characteristics at low temperature.

The charging unit 420 charges a Q node NQ and includes a capacitor C1 with a first end connected to the source of the transistor T4, the pull-up unit 430 and the discharging unit 450 and a second end connected to a gate output terminal OUT1.

The pull-up unit 430 is enabled in response to the previous stage gate signal Gout(j−1) inputted through the buffer unit 410, and pulls up the gate a level of the gate signal Gout(j) using a signal inputted to the first clock terminal CK1, e.g., the clock signal CKV. The pull-up unit 430 may include, for example, a transistor T1, which has a drain electrode connected to the first clock terminal CK1, a gate electrode connected to the charging unit 420 and the buffer unit 410, and a source electrode connected to the gate output terminal OUT1.

The carry signal generating unit 470 generates a carry signal Cout(j) in response to the previous stage gate signal Gout(j−1) inputted through the buffer unit 410. In more detail, the carry signal generating unit 470 is enabled in response to the previous stage gate signal Gout(j−1), and generates the carry signal Cout(j) having a pulled-up level using the clock signal CKV inputted to the first clock terminal CK1. The carry signal generating unit 470 may include, for example, a transistor T15 which has a drain electrode connected to the first clock terminal CK1, a source electrode connected to the carry output terminal OUT2 and the carry signal pull-down unit 480, and a gate electrode connected to the buffer unit 410, and a capacitor C2 connected to the gate and source electrodes of the transistor T15.

The pull-down unit 440 is enabled in response to the next stage gate signal Cout(j), and pulls down a level of the gate signal Gout(j) using the first gate-off voltage Voff1. The pull-down unit 440 may include a transistor T2 having a drain electrode connected to the drain output terminal OUT1 and the second end of the capacitor C1, a source electrode connected to a first power supply voltage terminal GV1, and a gate electrode connected to a first reset terminal R1. Here, the first gate-off voltage Voff1 supplied to the pull-down unit 440 may be lower than the second gate-off voltage Voff2 supplied to the holding unit 460. For example, in a case where the holding unit 460 holds the level of the gate signal Gout(j) at a gate-off voltage level, e.g., −6V, during the second gate-off period P3 using the second gate-off voltage Voff2 of −6V, the pull-down unit 440 pulls down the gate signal Gout(j) at a gate-on voltage level, e.g., 20V, using the first gate-off voltage Voff1 of −12V, which is lower than −6V.

Thus, the pull-down unit 440 is capable of effectively pulling down the level of the gate signal Gout(j) using a relatively low gate-off voltage. Accordingly, a delay characteristic of the gate signal Gout(j) shifting from a gate-on voltage level to a gate-off voltage level can be improved, thereby preventing deterioration in the display quality of the display device.

The carry signal pull-down unit 480 is enabled in response to the clock signal CKV inputted to the first clock terminal CK1, and pulls a level of the carry signal Cout(j) using the first gate-off voltage Voff1. In more detail, the carry signal pull-down unit 480 pulls down the level of the carry signal Cout(j) applied to the gate of the transistor T2 of the pull-down unit 440 using the first gate-off voltage Voff1 to the a level of the first gate-off voltage Voff1, thereby preventing the transistor T2 of the pull-down unit 440 to which the first gate-off voltage Voff1 is applied from being continuously turned ON. The carry signal pull-down unit 480 may include, for example, a transistor T16, which has a drain electrode connected to the carry output terminal OUT2 of the carry signal generating unit 470, a source electrode connected to the first power supply voltage terminal GV1, and a gate electrode connected to a source electrode of a transistor T7 and a drain electrode of a transistor T8.

The discharging unit 450 may include a transistor T9, which has a gate electrode connected to the second reset terminal R2 and a drain electrode connected to the first end of the capacitor C1, and a source electrode connected to the second power supply voltage terminal GV2 and discharges the charging unit 420 in response to the gate signal Gout(j+1) of the next stage ST_j+1, and a transistor T6, which has a gate electrode connected to a frame reset terminal FR, a drain electrode connected to a first end of a capacitor C3, and a source electrode connected to the second power supply voltage terminal GV2, and discharges the charging unit 420 in response to the initialization signal INT.

The holding unit 460 is connected to the gate output terminal OUT1, and includes transistors T3, T5, T7, T8, T10, T11, T12, T13, and capacitors C3, C4. The holding unit 460 holds a gate-on voltage level when the gate signal Gout(j) is pulled up to a level of the gate signal Gout(j). On the other hand, after the gate signal Gout(j) is pulled down from the gate-on voltage level to a second gate-off voltage level, holds the voltage gate signal Gout(j) at the second gate-off voltage level during one frame period irrespective of voltage levels of the clock signal CKV and the clock bar signal CKVB.

In particular, since the second gate-off voltage Voff2, which is higher than the first gate-off voltage Voff1, is applied to the holding unit 460 of the display device according to an exemplary embodiment of the present invention, deterioration in display quality of the display device, which is caused by a relatively low gate-off voltage level, can be prevented. In this regard, in order to improve a delay characteristic of the gate signal Gout(j) shifting from a gate-on voltage level to a gate-off voltage level, the gate-off voltage level of the gate signal Gout(j) may be lowered. However, the lowering of the gate-off voltage level of the gate signal Gout(j) may cause a difference in the charged amount between pixels PX, thereby deteriorating the display quality of the display device. However, the display device is capable of preventing the deterioration of the display quality of the display device due to the charging difference between pixels PX by rapidly pulling down the level of the gate signal Gout(j) such that a relatively low voltage level, i.e., the first gate-off voltage Voff1, is applied to the pull-down unit 440 and a relative high voltage level, i.e., the second gate-off voltage Voff2, is applied to the holding unit 460.

The operation of the jth stage will now be described in more detail with reference to FIGS. 4a and 5.

First, a process of the gate signal Gout(j)) being shifted from the gate-off voltage Voff to the gate-on voltage Von will be described.

The charging unit 420 is supplied with the previous stage gate signal Gout(j−1) shown in FIG. 5 and is charged. In more detail, the charging unit 420 is enabled in response to the previous stage gate signal Gout(j−1), by which a voltage of a Q node NQ increases slowly. During a period in which the clock signal CKV shifting from a low level to a high level is inputted, the voltage of the Q node NQ increases again by the capacitor C1 between the transistor T1 and the Q node NQ. The voltage of the charging unit 420, that is, the voltage of the Q node NQ, is boosted to a predetermined charged level, as shown in FIG. 5, the transistor T1 of the pull-up unit 430 is completely turned ON, so that the level of the gate signal Gout(j) is pulled up using the high-level clock signal CKV inputted through the first clock terminal CK1.

In addition, if the gate signal Gout(j) is pulled up to the gate-on voltage level, the transistors T8, T13 of the holding unit 460 are turned ON, the pulled-on gate signal Gout(j) can be held at the level of the gate-on voltage Von. In more detail, the transistor T7 is turned OFF by the transistor T13 to prevent the high-level clock signal CKV from being supplied to the transistor T3, and the transistor T3 is turned OFF by the transistor T8 to hold the pulled-up gate signal Gout(j) at the level of the gate-on voltage Von. Accordingly, the gate signal Gout(j) held at the level of the gate-on voltage Von during the gate-on period P1 can be applied to the gate lines G1-G2n.

Similarly, the carry signal generating unit 470 generates the carry signal Cout(j) having the level of the gate-on voltage Von as the voltage of the Q node NQ increases to a predetermined charged level to turn the transistor T15 ON.

Next, a process of the gate signal Gout(j)) being shifted from the gate-on voltage Von to the gate-off voltage Voff will be described.

When the clock signal CKV goes low during the first gate-off period P2, and the clock bar signal CKVB and the gate signal Gout(j+1) of the next stage go high, a voltage level of the Q node NQ decreases to disable the pull-up unit 430. In more detail, while the clock signal CKV is held at a low level as the voltage level is shifted from high level to low level, the voltage of the Q node NQ is lowered by the capacitor C1. In addition, as the gate signal Gout(j+1) of the next stage goes high, the transistor T9 of the discharging unit 450 is turned ON to supply the Q node NQ with the second gate-off voltage Voff2. As the clock bar signal CKVB goes high, the transistor T11 of the holding unit 460 is turned ON to supply the Q node NQ with the previous stage gate signal Gout(j−1) having the second gate-off voltage Voff2, so that a voltage level of the Q node NQ is lowered. Accordingly, the transistor T1 of the pull-up unit 430 is turned OFF to disable the pull-up unit 430.

In addition, when the carry signal Cout(j+1) of the next stage go high, the transistor T2 of the pull-down unit 440 is turned ON to supply the gate output terminal OUT1 with the first gate-off voltage Voff1 In other words, the pull-down unit 440 pulls down the level of the gate signal Gout(j) using the first gate-off voltage Voff1, the gate signal Gout(j) is shifted from the gate-on voltage Von to a predetermined gate-off voltage Voff1_a and held thereat during the first gate-off period P2. Here, the predetermined gate-off voltage Voff1_a has a level lower than that of the second gate-off voltage Voff2 and higher than or substantially the same as that of the first gate-off voltage Voff1

That is to say, since the pull-down unit 440 uses the first gate-off voltage Voff1, which is lower than the second gate-off voltage Voff1 supplied to the holding unit 460 that holds the level of the gate signal Gout(j) during the second gate-off period P3, the levels of the gate signals Gout(1)-Gout(2n) can be rapidly pulled down.

Next, a process of holding the level of the gate signal Gout(j)) at the level of the gate-off voltage Voff during one frame period after the gate signal Gout(j)) is pulled down to the predetermined gate-off voltage Voff1_a will be described.

After the gate signal Gout(j) is shifted from the gate-on voltage Von to the predetermined gate-off voltage Voff1_a, the transistors T8, T13 of the holding unit 460 are turned OFF. The holding unit 460 holds the gate signal Gout(j) at the level of the second gate-off voltage Voff2 during the second gate-off period P3.

In more detail, if the clock bar signal CKVB is held at high level during the second gate-off period P3, the transistors T5, T11 may be turned ON. The turned-ON transistor T5 applies the second gate-off voltage Voff2 to the gate output terminal OUT1, and the turned-ON transistor T11 holds the first end of the capacitor C1 at low level. On the other hand, if the clock signal CKV is held at high level during the second gate-off period P3, the transistors T7, T12 may be turned ON. Accordingly, the second gate-off voltage Voff1 is applied to the gate output terminal OUT1. In addition, the transistor T10 is turned ON and the gate electrode of the transistor T1 is held at low level, so that the high-level clock signal CKV may not be applied to the gate output terminal OUT1. Thus, the gate signal Gout(j) is shifted from the predetermined gate-off voltage Voff1_a to the second gate-off voltage Voff2 and held thereat during the second gate-off period P3. Here, second gate-off voltage Voff2 of the gate signal Gout(j) may be substantially the same as the second gate-off voltage Voff2.

Although the operation of the jth stage ST_j configured by the illustrated circuit diagram shown in FIG. 4a has been described with reference to FIG. 5, substantially the same operation can also be applied to the jth stage ST_j' configured by an illustrated circuit diagram shown in FIG. 4b, an explanation of which will not be given.

A display device according to an exemplary embodiment of the present invention will now be described with reference to FIG. 6.

Referring to FIGS. 1 through 6, unlike the display device according to the exemplary embodiment of FIG. 1, the display device 11 includes a first clock unit 401 generating gate signal Gout(1)-Gout(2n) in response to a first clock signal CKV and a first clock bar signal CKVB, and a second clock unit 402 generating gate signal Gout(1)-Gout(2n) in response to a second clock signal CKV and a second clock bar signal CKVB.

Figure 6:
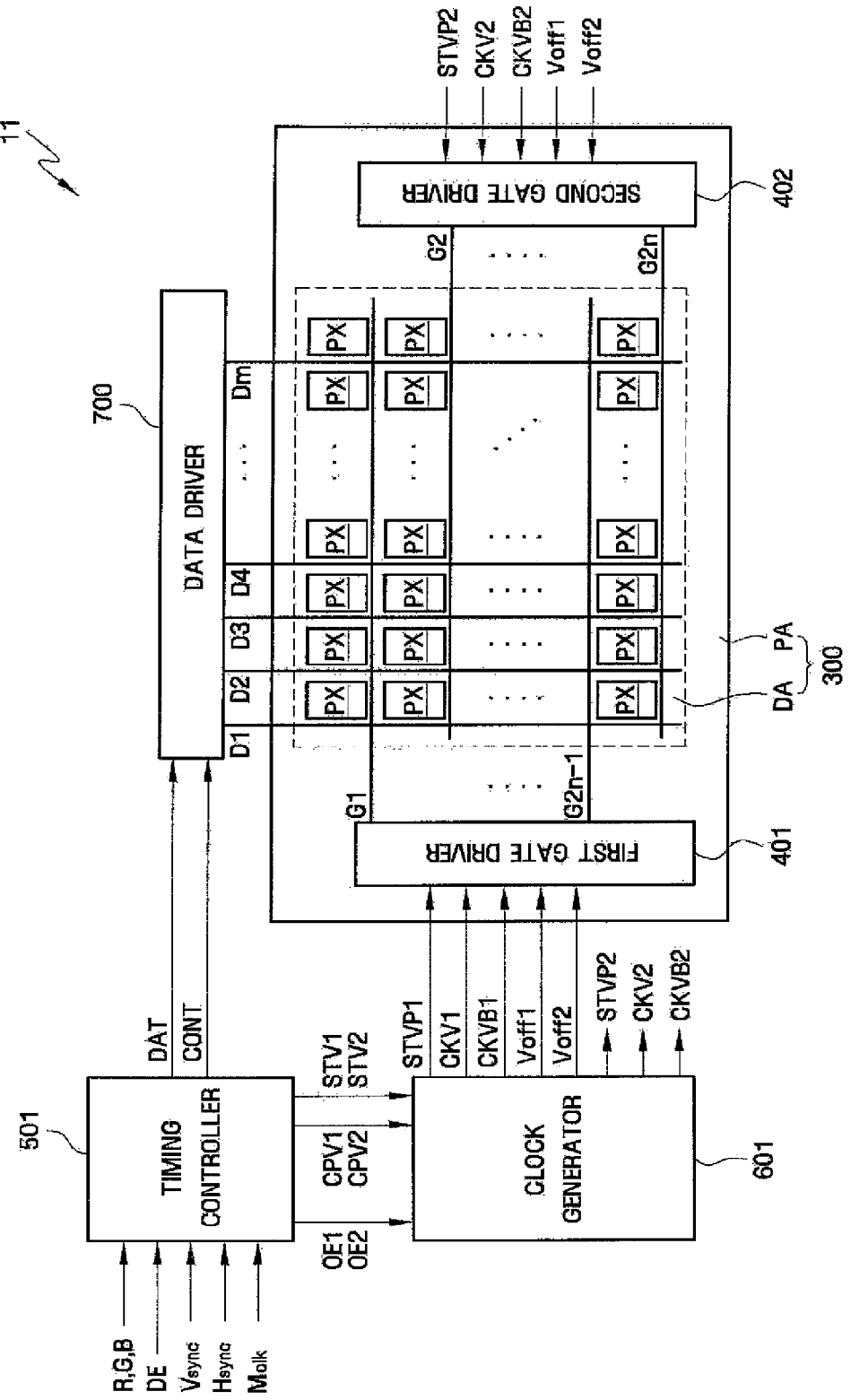
FIG. 6 is a block diagram of a display device according to an exemplary embodiment of the present invention.

In more detail, in the display device 11 according to the exemplary embodiment of the present invention of FIG. 6, a clock generator 601 supplies the first gate driver 401 with a first clock signal CKV1, a first clock bar signal CKVB1 and a first scanning start signal STVP1 in response to a first output enable signal OE1, a first gate clock signal CKV1 and a first primitive scanning start signal STV1 supplied from a timing controller 501. In addition, the clock generator 601 supplies the second gate driver 402 with a second clock signal CKV2, a second clock bar signal CKVB2, and a second scanning start signal STVP2 in response to a second output enable signal OE2, a second gate clock signal CKV2 and a first primitive scanning start signal STV2 supplied from the timing controller 501.

Accordingly, the first and second gate drivers 401, 402 can sequentially apply gate signals Gout(1)-Gout(2n) to a plurality of gate lines G1-G2n. For example, the first gate drivers 401 may supply the odd-numbered gate signals G1-G2n−1 among the gate lines Gout(2)-Gout(2n) using the first clock signal CKV1, the first clock bar signal CKVB1, the first scanning start signal STVP1, the first gate-off voltage Voff1 and the second gate-off voltage Voff. By contrast, the second gate driver 402 may supply the even-numbered gate signals G2-G2n among the gate lines Gout(1)-Gout(2n) using the second clock signal CKV2, the second clock bar signal CKVB2, the second scanning start signal STVP2, the first gate-off voltage Voff1 and the second gate-off voltage Voff. The first and second gate drivers 401, 402 are provided at both sides of the display panel 300, as shown in FIG. 6, and are connected to the display panel 300.

The first and second gate drivers 401, 402 are substantially the same as the gate driver 400 described with reference to FIGS. 3 through 5 except that the gate signals Gout(1)-Gout(2n) are applied to the odd- or even-numbered gate lines G1-G2n, and a detailed explanation thereabout will not be given.

Figure 7:
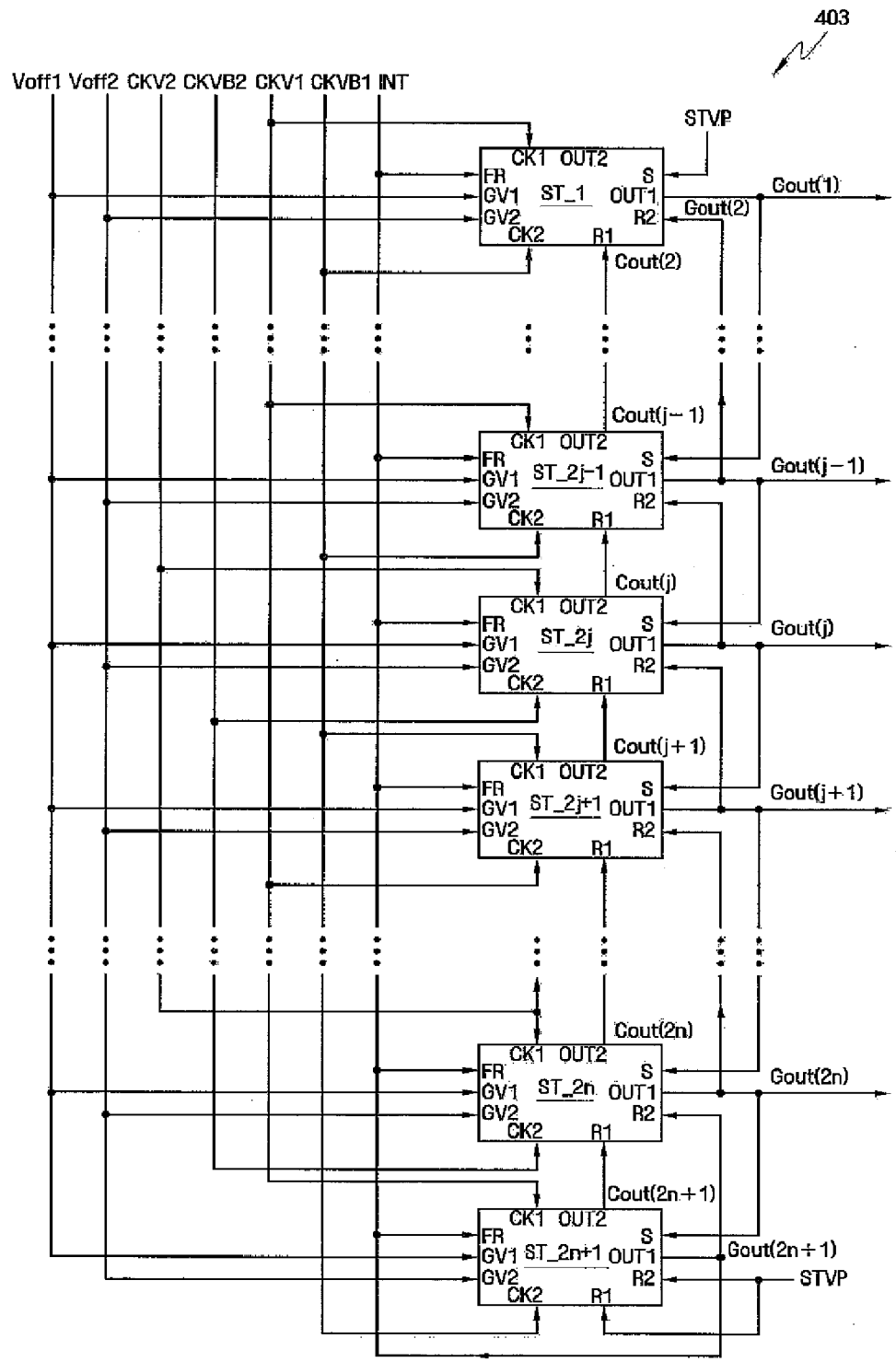
FIG. 7 is a block diagram of a gate driver of a display device according to the an exemplary embodiment of the present invention.
Figure 8:
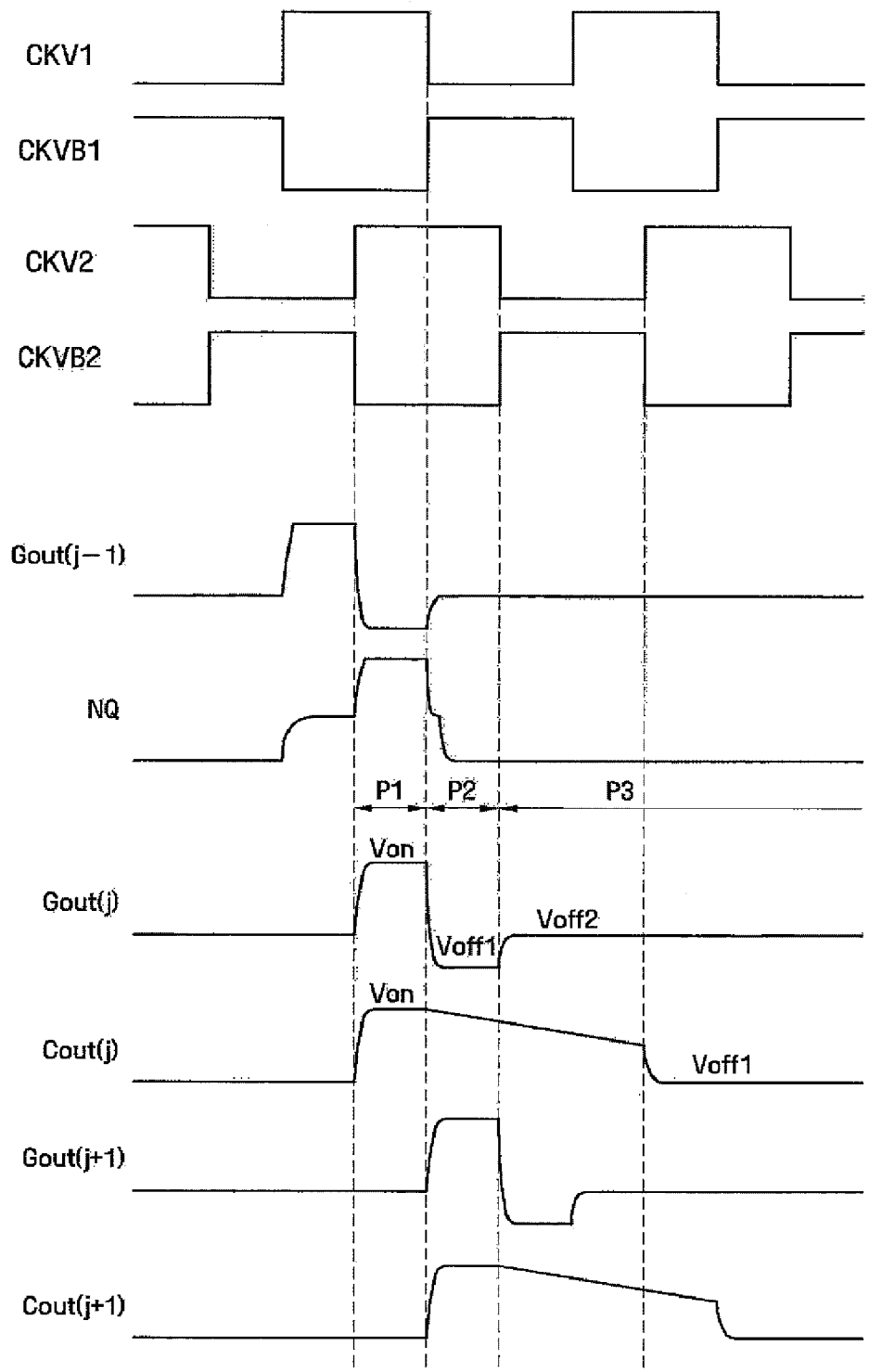
FIG. 8 is a timing diagram for explaining the operation of a jth stage shown in FIG. 7.

The display device according to an exemplary embodiment of the present invention will now be described with reference to FIGS. 1, 2, 4a, 4b, 7 and 8. FIG. 7 is a block diagram of a gate driver of a display device according to an exemplary embodiment of the present invention, and FIG. 8 is a timing diagram for explaining the operation of a jth stage shown in FIG. 7.

Figure 3:
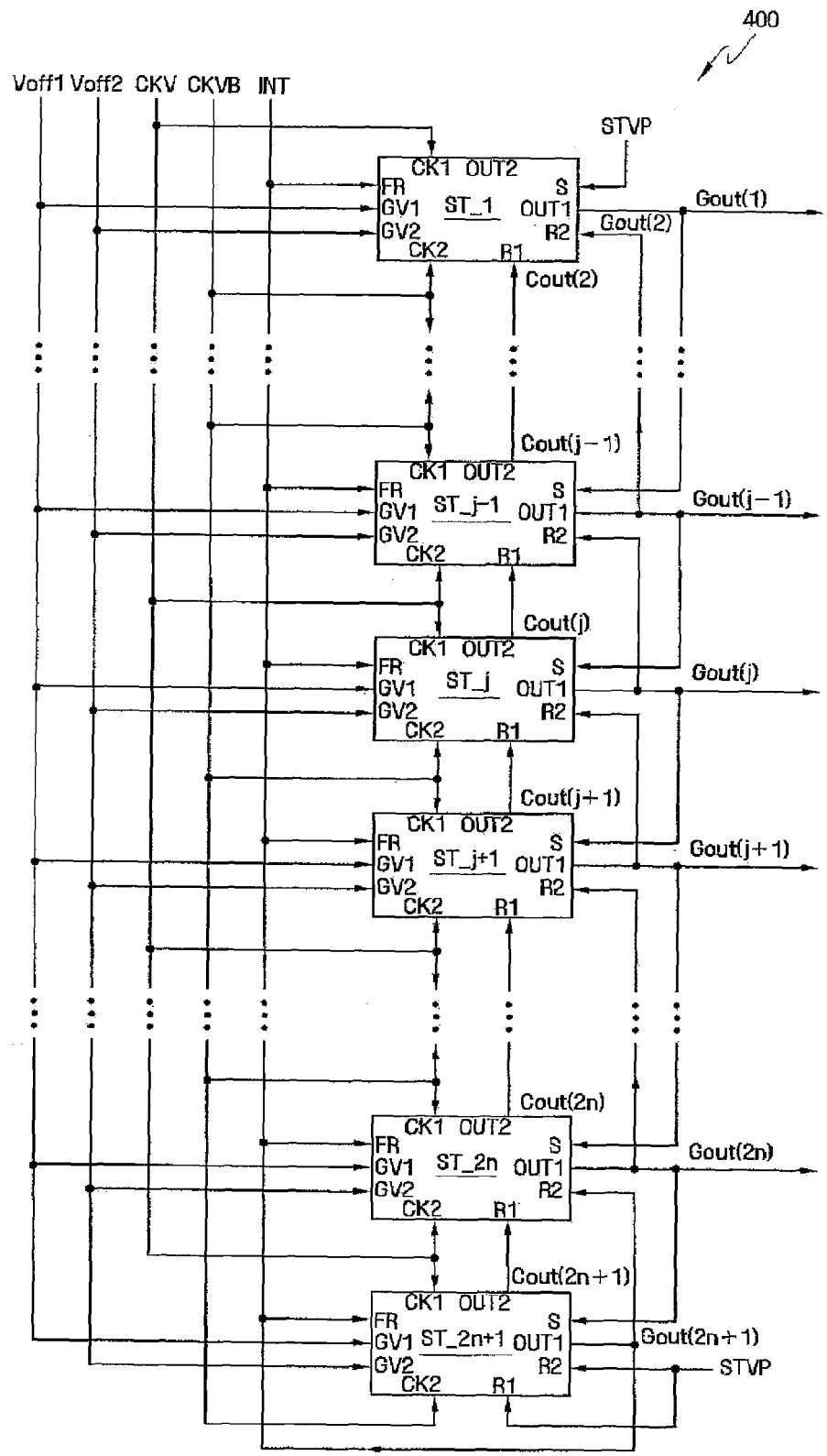
FIG. 3 is a block diagram of a gate driver shown in FIG. 1.
Figure 4B:
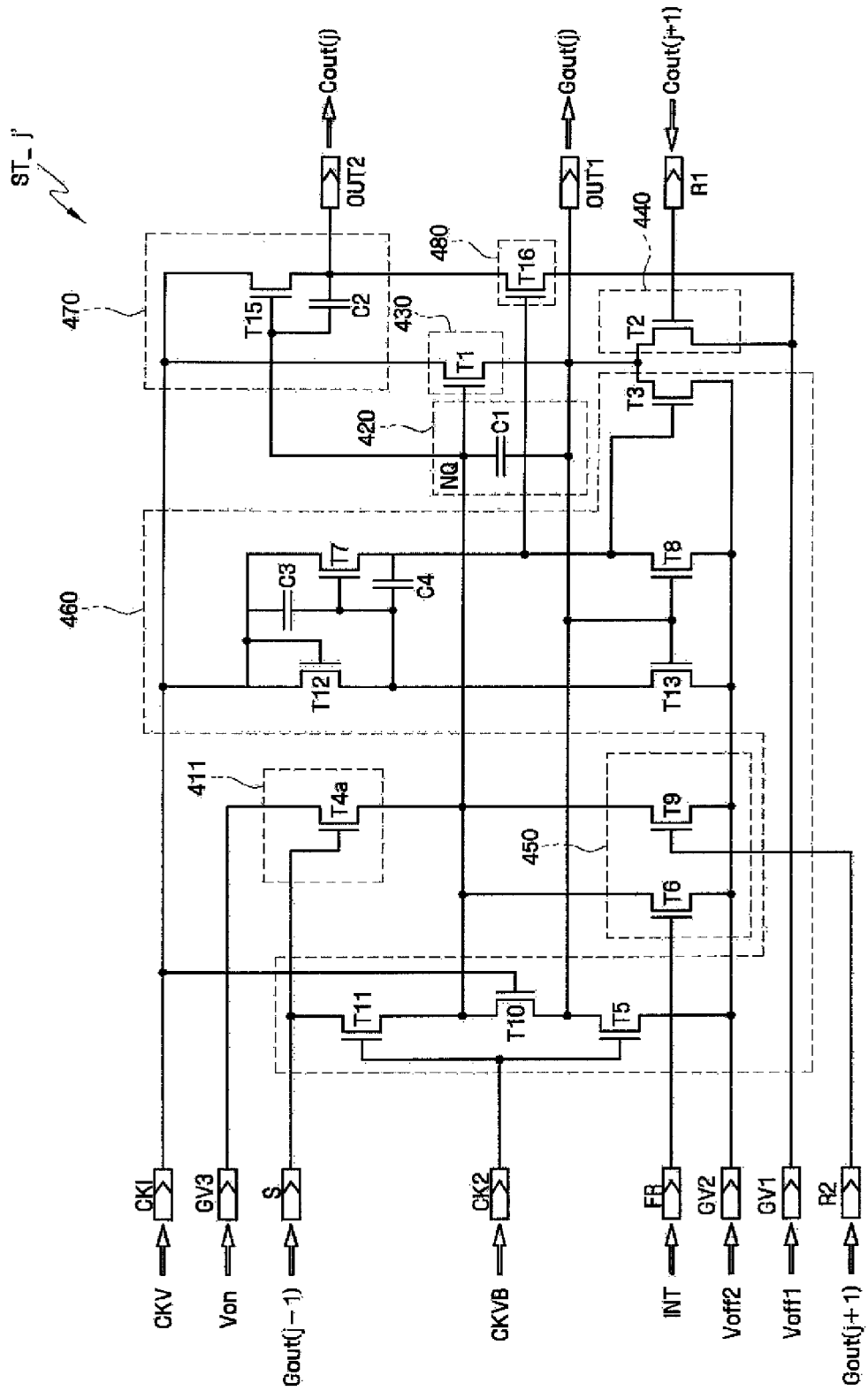

Referring to FIGS. 1, 2, 4a, 4b, 7 and 8, unlike the gate driver 400 of FIG. 3, a gate driver 403 of FIG. 7 includes stages ST_1-ST_2n supplied with first and second clock signals CKV1, CKV2, and first and second clock bar signals CKVB1, CKVB2. In addition, unlike the gate drivers 401, 402, the pull-up unit 430 of the gate driver 403 is enabled in response to the gate signal Gout(j+1) of the (j+1)th stage ST_j+1.

In more detail, the gate driver 403 includes a first stage group supplied with a first clock signal CKV1 and a first clock bar signal CKVB1, and a second stage group supplied with a second clock signal CKV2 and a second clock bar signal CKVB2. For example, stages belonging to the first stage group are odd-numbered gate lines G1-G2n−1 among stages ST_1-ST_2n, and are supplied with the first clock signal CKV1 and the first clock bar signal CKVB1 to apply gate signals Gout(1)-Gout(2n−1) to the odd-numbered gate lines G1-G2n−1). Similarly, stages belonging to the second stage group are even-numbered gate lines ST_2-ST_2n among the stages ST_1-ST_2n, and are supplied with the second clock signal CKV2 and the second clock bar signal CKVB2 to apply gate signals Gout(2)-Gout(2n) to the even-numbered gate lines G2-G2n.

However, unlike in the display device 10, the gate driver 403 includes the first and second gate drivers 401, 402 having the jth stage ST_j supplying the gate line Gj with the gate signal Gout(j) in response to a gate signal Gout(j−1) of a (j−1) the stage ST_j−1, a gate signal Gout(j+1) of a (j+1) stage ST_j+1), and a carry signal Cout(j+1) of the (j+1)th stage ST_j+1. In more detail, the pull-up unit 430 of the jth stage ST_j is enabled in response to the gate signal Gout(j−1) of a (j−1) the stage ST_j−1, thereby providing a pulled-up gate signal Gout(j). On the other hand, a pull-down unit 440 of the jth stage ST_j supplies a pulled-down gate signal Gout(j) in response to the carry signal Cout(j+1) of the (j+1)th stage ST_j+1 during the first gate-off period P2. In addition, a discharging unit 450 of the jth stage ST_j discharges the charging unit 420 in response to the gate signal Gout(j+1) of the (j+1)th stage ST_j+1 during the first gate-off period P2.

Accordingly, unlike the gate driver 400 of the display device 10, the gate driver 403 can provide the gate signals Gout(1)-Gout(2n) each having a shorter period of the gate-on voltage Von than periods in which the first and second clock signals CKV1, CKV2 or the first and second clock bar signals CKVB1, CKVB2 are held at high levels.

In other words, the display device can provide the gate signals Gout(1)-Gout(2n) having the same frequency as that of the display device according to the previous exemplary embodiments of the present invention even by using the first and second clock signals CKV1, CKV2 or the first and second clock bar signals CKVB1, CKVB2, which have longer frequencies.

Accordingly, the display device can be driven by the first and second clock signals CKV1, CKV2 or the first and second clock bar signals CKVB1, CKVB2, which have relatively long frequencies, thereby reducing power consumption.

When the gate driver 403 operates as shown, the gate signals Gout(1)-Gout(2n) are forcibly pulled downed at the level of gate-on voltage Von during the period in which the first and second clock signals CKV1, CKV2 or the first and second clock bar signals CKVB1, CKVB2 are held at high levels. Accordingly, as described above, a delay characteristic of the gate signals Gout(1)-Gout(2n) shifting from a gate-on voltage level to a gate-off voltage level may become severe, which may cause deterioration to the display quality of the display device.

The display device according to an exemplary embodiment of the present invention, however, pulls down the levels of the gate signal Gout(1)-Gout(2n) by the pull-down unit 440 using the first gate-off voltage Voff1, which is lower than the second gate-off voltage Voff2, the deterioration to the display quality of the display device can be prevented due to the delay characteristic.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the exemplary embodiments be considered in all respects as illustrative and not restrictive, reference being made to the appended claims rather than the foregoing description to indicate the scope of the invention.

What is claimed is:

1. A display device comprising:
   a display panel having gate lines and data lines; and
   a gate driver having stages that supply the gate lines with gate signals using a clock signal and a clock bar signal, each of the stages including:
      a gate output terminal through which a gate signal is outputted,
      a pull-down unit, connected to the gate output terminal, that pulls down a level of the gate signal from a gate-on voltage to a first voltage level using a first gate-off voltage, and
      a holding unit, connected to the gate output terminal, that holds a level of a pulled-down gate signal at a second voltage level using a second gate-off voltage, which is higher than the first gate-off voltage,
      wherein the second voltage level is higher than the first voltage level.

2. The display device of claim 1, wherein each of the stages further comprises:
   a carry signal generating unit that generates a carry signal; and
   a carry signal pull-down unit, connected to the carry signal generating unit, that pulls down a level of the carry signal using the first gate-off voltage.

3. The display device of claim 2, wherein:
   each of the stages further comprises a pull-up unit, connected to the gate output terminal, that pulls up a level of the gate signal, and
   a pull-up unit of the jth stage among the stages is enabled in response to a gate signal of the (j−1)th stage, where j>1, j being a natural number.

4. The display device of claim 3, wherein a pull-down unit of the jth stage among the stages is enabled in response to a carry signal of the (j+1)th stage.

5. The display device of claim 1, wherein:
   the clock signal includes a first clock signal and a second clock signal,
   the clock bar signal includes a first clock bar signal and a second clock bar signal, the gate driver includes:
      a first gate driver that supplies the gate signal using the first clock signal and the first clock bar signal, and
      a second gate driver that supplies the gate signal using the second clock signal and the second clock bar signal.

6. The display device of claim 5, wherein the first gate driver is positioned at one side of the display panel and the second gate driver is positioned at an other side of the display panel.

7. The display device of claim 1, wherein:
   each of the stages comprises a pull-up unit, connected to the gate output terminal, that pulls up a level of the gate signal,
   the clock signal includes a first clock signal and a second clock signal,
   the stages further comprise:
      a first stage group that supplies the gate signal using the first clock signal and the first clock bar signal,
      a second stage group that supplies the gate signal using the second clock signal and the second clock bar signal, and
   wherein the pull-up unit of the jth stage among the stages is enabled in response to the gate signal of the (j−1)th stage, where j>1, j being a natural number.

8. The display device of claim 1, wherein each of the stages includes at least one amorphous silicon thin film transistor on the display panel.

9. A display device comprising:
   a display panel having gate lines and data lines; and
   a gate driver having stages that supply the gate lines with gate signals using a clock signal and a clock bar signal, each of the stages including:
      a gate output terminal through which a gate signal is outputted,
      a pull-down unit, connected to the gate output terminal, that pulls down a level of the gate signal using a first gate-off voltage, and
      a holding unit, connected to the gate output terminal, that holds a level of a pulled-down gate signal at a level of a second gate-off voltage using the second gate-off voltage, which is higher than the first gate-off voltage,
   wherein each of the stages further comprises:
      a carry signal generating unit that generates a carry signal; and
      a carry signal pull-down unit, connected to the carry signal generating unit, that pulls down a level of the carry signal using the first gate-off voltage,
   wherein:
      each of the stages further comprises a pull-up unit, connected to the gate output terminal, that pulls up a level of the gate signal, and
      a pull-up unit of the jth stage among the stages is enabled in response to a gate signal of the (j−1)th stage, where j>1, j being a natural number,
   wherein:
      the stages are divided into a first stage group and a second stage group, and
      the carry signal pull-down unit of each of the stages included in the first stage group is enabled in response to the clock signal, and the carry signal pull-down unit of each of the stages included in the second stage group is enabled in response to the clock bar signal.

10. A display device comprising:
    a display panel having gate lines and data lines; and
    a gate driver having stages that supply the gate lines with gate signals using a clock signal and a clock bar signal, each of the stages including:
       a gate output terminal through which a gate signal is outputted,
       a pull-down unit, connected to the gate output terminal, that pulls down a level of the gate signal using a first gate-off voltage, and
       a holding unit, connected to the gate output terminal, that holds a level of a pulled-down gate signal at a level of a second gate-off voltage using the second gate-off voltage, which is higher than the first gate-off voltage,
    wherein each of the stages further comprises:
       a carry signal generating unit that generates a carry signal; and
       a carry signal pull-down unit, connected to the carry signal generating unit, that pulls down a level of the carry signal using the first gate-off voltage, and
    wherein a level of the carry signal is lower than the level of the gate signal during a period in which the level of the gate signal is held at the second gate-off voltage level.

11. A display device comprising:
    a display panel having gate lines and data lines; and
    a gate driver having stages that supply the gate lines with gate signals using a clock signal and a clock bar signal, each of the stages including:
       a gate output terminal through which a gate signal is outputted,
       a pull-down unit, connected to the gate output terminal, that pulls down a level of the gate signal using a first gate-off voltage, and
       a holding unit, connected to the gate output terminal, that holds a level of a pulled-down gate signal at a level of a second gate-off voltage using the second gate-off voltage, which is higher than the first gate-off voltage,
    wherein the gate signal has a shorter period of a gate-on voltage than a period in which the clock signal or the clock bar signal is held at a high level.

12. A display device comprising:
    a display panel having switching elements at intersection areas of gate lines and a data lines; and
    a gate driver that supplies the gate lines with gate signals that turn ON and turn OFF the switching elements, each of gate signals having a gate-on period in which the switching elements are turned ON, and a first gate-off period and a second gate-off period in which the switching elements are turned OFF, wherein the gate signals have a level of the gate-on voltage during the gate-on period, the gate signals being shifted from the level of the gate-on voltage to a level of a third gate-off voltage and held at the third gate-off voltage level during the first gate-off period, and the gate signals being shifted from the third gate-off voltage level to the second gate-off voltage level, which is higher than the third gate-off voltage level, and held at the second gate-off voltage level during the second gate-off period.

13. The display device of claim 12, wherein the gate driver comprises stages that output a gate signal, each of the stages comprising:

a gate output terminal through which the gate signal is outputted;

a pull-down unit, connected to the gate output terminal, that pulls down a level of the gate signal to the third gate-off voltage level using the first gate-off voltage;

a holding unit, connected to the gate output terminal, that holds the gate signal at the second gate-off voltage level using the second gate-off voltage, which is higher than the first gate-off voltage;

a carry signal generating unit that generates a carry signal; and a carry signal pull-down unit, connected to the carry signal generating unit, that pulls down a level of the carry signal to the first gate-off voltage level using the first gate-off voltage.

14. The display device of claim 13, wherein:

each of the stages further comprises a pull-up unit, connected to the gate output terminal, that pulls up a level of the gate signal, the pull-down unit of the jth stage among the stages is enabled in response to the carry signal of the (j+1)th stage, where j>1, j being a natural number, and the pull-up unit is enabled in response to the gate signal of the (j−1)th stage.

15. The display device of claim 13, wherein the third gate-off voltage level is substantially the same as the first gate-off voltage level.

16. The display device of claim 12, wherein the gate driver supplies the gate signals using a clock signal and a clock bar signal, each of gate signals having a shorter period of the gate-on voltage than a period in which the clock signal or the clock bar signal is held at a high level.

17. A method of driving a display device comprising:

supplying gate lines and data lines with a gate signals from a gate driver using a clock signal and a clock bar signal; and displaying images using the gate signals and data signals, wherein the supplying comprises:

pulling up a level of each of the plurality of gate signals to a level of a gate-on voltage;

pulling down the level of each of the plurality of gate signals from the gate-on voltage level using a first gate-off voltage;

shifting the level of each of the plurality of gate signals to a level of a second gate-off voltage, which is higher than the first gate-off voltage; and holding the gate signal at the second gate-off voltage level.

18. The method of claim 17, wherein:

the gate driver comprises stages that provide the gate signals and carry signals, and the jth stage among the stages pulls down a level of each of the plurality of gate signals in response to the carry signal of the (j+1)th stage, where j>1, j being a natural number, and pulls up the level of each of the gate signals in response to the gate signal of the (j−1)th stage.

19. The method of claim 18, wherein each of the stages is adapted to pull down a level of each of the carry signals to the first gate-off voltage level using the first gate-off voltage.

20. The method of claim 17, wherein each of the gate signals has a shorter period of the gate-on voltage than a period in which the clock signal or the clock bar signal is held at a high level.

* * * * *